United States Patent
Oberle et al.

(10) Patent No.: US 7,254,502 B2
(45) Date of Patent: Aug. 7, 2007

(54) METHOD AND DEVICE FOR DETECTING PERIOD LENGTH FLUCTUATIONS OF PERIODIC SIGNALS

(75) Inventors: Hans-Dieter Oberle, Puchheim (DE); Sebastian Sattler, München (DE)

(73) Assignee: Infineon Technologies AG (DE)

( * ) Notice: Subject to any disclaimer, the term of this patent is extended or adjusted under 35 U.S.C. 154(b) by 149 days.

(21) Appl. No.: 10/525,163

(22) PCT Filed: Aug. 8, 2003

(86) PCT No.: PCT/EP03/08844

§ 371 (c)(1),
(2), (4) Date: Feb. 22, 2005

(87) PCT Pub. No.: WO2004/025836

PCT Pub. Date: Mar. 25, 2004

(65) Prior Publication Data
US 2005/0241362 A1    Nov. 3, 2005

(30) Foreign Application Priority Data
Aug. 26, 2002 (DE) ................................ 102 39 099

(51) Int. Cl.
*G01R 29/02* (2006.01)
(52) U.S. Cl. ..................... 702/79; 324/76.47
(58) Field of Classification Search ...... 702/FOR. 107, 702/79; 73/1.42; 324/76.47, 76.48; 331/44
See application file for complete search history.

(56) References Cited

U.S. PATENT DOCUMENTS

| | | | | |
|---|---|---|---|---|
| 3,503,047 A | * | 3/1970 | Schaepman | 702/79 |
| 3,721,910 A | * | 3/1973 | Wilmannis et al. | 324/76.47 X |
| 4,350,950 A | * | 9/1982 | Waldmann et al. | 324/76.61 |
| 4,463,425 A | * | 7/1984 | Hirano et al. | 702/79 X |
| 4,672,329 A | * | 6/1987 | Hikawa | 331/1 A |
| 4,680,540 A | * | 7/1987 | Niki et al. | 324/76.48 X |
| 6,735,538 B1 | * | 5/2004 | Yamaguchi et al. | 702/79 X |
| 7,082,175 B2 | * | 7/2006 | Rotsch et al. | 375/356 |
| 7,142,998 B2 | * | 11/2006 | Watson, Jr. et al. | 702/79 X |
| 2006/0235635 A1 | * | 10/2006 | Intrator et al. | 702/79 |

FOREIGN PATENT DOCUMENTS

| | | | |
|---|---|---|---|
| DE | 29 21 899 | 1/1980 | |
| DE | 36 15952 A1 | 11/1986 | 375/362 |
| DE | 101 14 410 A1 | 10/2001 | |
| DE | 100 46 920 A1 | 4/2002 | |
| EP | 700045 A2 | * 3/1996 | |
| GB | 2068128 A | * 8/1981 | 374/41 |

* cited by examiner

*Primary Examiner*—Thomas P. Noland
(74) *Attorney, Agent, or Firm*—Brinks Hofer Gilson & Lione

(57) ABSTRACT

To determine the period length of a first signal, the length is measured by counting the periods of a second signal with a shorter period length. To measure the fluctuations of the period length of the first signal whilst also taking into account the fluctuations of the period length of the second signal, the measurement is carried out for two different values of the period length of the second signal. Both the fluctuations of the period length of the first signal and the accumulated fluctuations of the period length of the second signal are calculated independently of one another from the two values. The method enables the period length fluctuations of a first signal that originates from a phase-locked loop to be detected.

19 Claims, 2 Drawing Sheets ized here by reference.
METHOD AND DEVICE FOR DETECTING PERIOD LENGTH FLUCTUATIONS OF PERIODIC SIGNALS

PRIORITY CLAIM

This application is the national stage application of International application number PCT/EP2003/008844, filed on Aug. 8, 2003, which claims the benefit of priority to German Patent Application 102 39 099.1, filed on Aug. 26, 2002, incorporated herein by reference.

BACKGROUND

1. Technical Field

The present invention relates to a method as well as an apparatus for detecting period length fluctuations of a periodic first signal and/or of a periodic second signal, whereby the period length of the second signal is shorter than that of the first signal and a reference number of periods of the second signal, which arise during a certain number of periods of the first signal is obtained.

2. Background Information

In the case of periodic signals disadvantageously fluctuations of the period length also arise. This can lead for example in digital technology to edge-controlled actions being triggered too early or too late causing malfunctions to arise. If for example in the case of serial data communication with data retrieval in a pre-determined cycle the analog value or the digital state of a line must be scanned, period length fluctuations of the scanning rate can lead to errors arising during data retrieval, since scanning is carried out at an incorrect time.

In order to measure the fluctuations of the period length of a periodic first signal, it is known to measure the duration of a period of the first signal several times by means of a periodic second signal, the period length of which is shorter than the period length of the first signal. In this case, a reference number of periods of the second signal, which arise during a period of the first signal and/or can be inscribed in a period is obtained. The period length of the first signal thereby corresponds to the reference number multiplied by the period length of the second signal. In this case, a quantization error arises, since the period length of the first signal is only resolved with an integral number of periods of the second signal, the quantization error falling with decreasing period length of the second signal. In addition, period length fluctuations of the second signal also have an effect on the measurement, whereby in relation to the second signal, the accumulated period length fluctuations make it possible to realize that in a measurement period the period length fluctuations of the reference number are added onto periods of the second signal. The period length fluctuations of the second signal therefore have a greater effect on the measurement result, the higher the reference number.

FIG. 1 illustrates the basic principle of this measurement process. In this case, a reference number m is defined in periods of the second signal 2, which can be inscribed in a period of the first signal 1. The period length of the first signal 1 is provided with the reference symbol 3 and features period length fluctuations, which are shown as broken lines. In known methods, in order to detect the period length fluctuations of the first signal 1, a signal 2 with very short period length fluctuations is used, so that the period length of individual periods of the first signal 1 can be measured with high precision. Vice-versa if the signal 1 is present with high precision and very short period length fluctuations, the accumulated or added period length fluctuations of the second signal can be detected. By multiple measurements of reference numbers m, the period length fluctuations of the first signal or the accumulated period length fluctuations of the second signal can therefore be measured, dependent on what signal with high precision and/or with short period fluctuations is present.

Disadvantageously, however, this requires at least a high precision signal with a very short period length fluctuation.

BRIEF SUMMARY

The underlying object of the present invention is to provide a method as well as an apparatus with which period length fluctuations of a periodic first signal are measured at low cost by counting a reference number, inscribable in the period of the first signal, of periods of a higher frequent periodic second signal without requiring any high precision reference signals.

In accordance with the invention, this object is achieved by a method with the features of claim 1 and/or an apparatus with the features of claim 10. The sub-claims in each case define preferred and advantageous embodiments of the present invention.

In accordance with the present invention, the reference number of periods of the second signal, which can be inscribed in one or several periods of the first signal is obtained. In this case, the measurement of this reference number is carried out for two different period lengths of the second signal. Dependent on the period length of the second signal also the reference number and the effect of the period length fluctuations of the second signal on the measurement precision change.

FIG. 2 shows for a first signal with a given period length the standard deviation σ of several measurements of the period length of the first signal 1 by counting inscribable periods of the second signal 2 over the reference number m. The standard deviation σ therefore relates to the entire error of the measurement, which depends both on period length fluctuations of the first signal 1 and also on the accumulated period length fluctuation of the second signal 2. The reference number m is proportionally dependent on the reciprocal value of the period length 4 of the second signal 2. The standard deviation σ is taken into account as a measure for the period length fluctuations.

The curve in FIG. 2 can be divided into three zones A to C. In zone A on the basis of the low reference numbers m the curve of the standard deviation is essentially defined by the quantization error, which is proportional to the period length 4 of the second signal 2 and/or vice-versa proportional to the reference number m. In zone A the curve of the standard deviation falls with increasing reference numbers m and reaches its minimum in zone B.

In zone B the standard deviation is defined both by the period length fluctuations of the first signal 1 as well as of the second signal 2. With rising value of the period length fluctuations of the first signal 1 the curve is raised and flattened out in the zone of the minimum.

Subsequently, the curve of the standard deviation rises with increasing reference numbers m. The curve in this zone essentially behaves proportionally to the square root of the reference number m.

In accordance with the invention, the measurement is now carried out several times for two different values of the period length 4 of the second signal 2. For a certain reference number m the standard deviation σ for the entire measurement is determined as follows $$\sigma^2 = a^2 + 2ay\rho + y^2$$

For roughly normally split period length fluctuations $\sigma_1$ of the first signal 1 and $\sigma_2$ of the second signal 2 a regression coefficient r can be calculated as follows $$r = \rho \cdot x,$$

whereby $x = y/a$, $y = \sigma_1$ and $a = \sigma_2 \cdot \sqrt{m}$

Determination of the standard deviation σ for the entire measurement at places m0 and m>m0 leads to the equations $$\sigma = \sqrt{\sigma_0^2 + \sigma_2^2 m_0 \frac{m}{m_0}(1 + 2r)(1 - A)} \text{ and}$$

$$\sigma = \sqrt{\sigma_0^2/A - \sigma_1^2(1 - A)/A}$$

for the period length fluctuations of the two signals 1, 2 and/or their standard deviations $\sigma^2 \cdot \sqrt{m_0}$ equal to the accumulated period length fluctuations of the second signal 2 and the period length fluctuations and/or the standard deviation of the first signal equal to $\sigma_1$ dependent on the measured quantities $m_0$, $\sigma_0$ and m, σ. The regression coefficient A is composed of the regression coefficients $m_0$, $r_0$ and m, r. In this case, A is calculated as follows $$A = \left(\frac{m_0}{m}\right)\left(\frac{1 + 2r_0}{1 + 2r}\right)$$

In the following, the regression coefficients resulting thereby are shown for several ratios of m to $m_0$

|  | m/m0 | | | |
| --- | --- | --- | --- | --- |
|  | 1.69 | 2.0 | 2.47 | 4.0 |
| $\bar{r}$ | 0.0323 | 0.0189 | 0.0094 | 0.0009 |
| $\bar{r}_0 = 0.1601$ | | | | |
| $\bar{A}$ | 0.7361 | 0.6387 | 0.5267 | 0.331 |

For greater clarity, FIG. 3 shows a diagram in which the standard deviation $\sigma_B$ of the entire measurement for a first period length of the second signal 2 is plotted towards the right and the standard deviation $\sigma_C$ of the entire measurement for a second shorter period length of the signal 2 is plotted upwards. A specific point in this diagram, for certain values of the standard deviation $\sigma_1$ of the period length fluctuation of the signal 1 and the accumulated standard deviation $\sigma_2 \sqrt{m}$ of the period length fluctuations of the second signal 2, reproduces the values for the standard deviations $\sigma_B$ and $\sigma_C$ of the entire measurement error, which result when the measurement is carried out with the two different period lengths 4 of the second signal 2. As an example, two groups of lines are drawn in the diagram, which represent the standard deviations of the entire measurement for the two period lengths of the second signal 2 in the case of constant standard deviation $\sigma_1$ of the period fluctuation of the first signal 1 and/or in the case of constant standard deviation $\sigma_2\sqrt{m}$ of the accumulated period length fluctuations of the second signal 2.

The substantially horizontal and straight running curve family represents the case where the standard deviation of the accumulated period length fluctuations of the second signal 2 is constant, the direction in which the standard deviation of the accumulated period length fluctuations of the second signal 2 rise, being indicated with the arrow pointing upwards, which is identified with $\sigma_2 \sqrt{m}$.

The other substantially perpendicularly running and upwards arched curve family represents the case where the standard deviation of the period length fluctuations of the first signal 1 is constant, the arrow pointing to the right, which is identified with $\sigma_1$, showing the direction, in which the standard fluctuations of the period length of the first signal 1 rise. An essentially angle-bisecting auxiliary straight line passing through the origin is also illustrated, the slope of which is the reciprocal value of the root of the regression coefficient A and which represents the asymptote for the curve family for constant standard deviation $\sigma_1$ of the period length fluctuation of the first signal 1.

In accordance with the invention, the values for the standard deviation of the period length fluctuations of the first signal 1 as well as the standard deviation of the accumulated period length fluctuations of the second signal 2 can now be read off in the diagram for 2 values $\sigma_B$ and $\sigma_C$ of the standard deviation of the entire measurement for two different period lengths 4 of the second signal 2. For this purpose, the curves $\sigma_1$=constant and $\sigma_2\sqrt{m}$=constant, the point of intersection of which marks the wanted place in the plane $\sigma_B$, $\sigma_C$ can be selected from the two curve families. These values can also be determined arithmetically using the equations $$\sigma_{acc} = \sigma_2 \sqrt{m_o} = \sqrt{\frac{\sigma^2 - \sigma_0^2}{\frac{m}{m_0}(1 + 2r)(1 - A)}} \quad \sigma_1 = \sqrt{\frac{\sigma^2 A}{1 - A}}$$

Through measurement with two different period lengths of the second signal 2 the period length fluctuations both of the first signal 1 and also in accumulated form of the second signal 2 can therefore be calculated independently of one another. This means that advantageously no high precision reference signal with especially short period length fluctuations is required.

In this way, the period length fluctuation of the first signal and/or second signal can be detected at low cost, as a result of which the method in accordance with the invention can also be implemented economically in integrated semiconductors as a self-test routine. For example, this is useful in the case of phase-locked loops, in order to be able to check the period length fluctuations of the output signal. Such a phase-locked loop can be used in data transmission for data retrieval in DSL data transmission systems for example.

To implement the method in accordance with the invention, it is basically immaterial how often the measurement is carried out, since evaluation of the standard deviation as a measure for period length fluctuations concerns a statistical method, advantageously the measurements for the two different period lengths of the second signal 2 being repeated several times, in order to achieve more reliable results. Naturally, the process can therefore be run in an integrated circuit or a corresponding device controlled by a microprogram, for example whenever these are switched on.

Up to now, the case where the measurement is only carried out for two different period lengths 4 of the second signal 2 has been described. However, in addition, it is also conceivable that three or more different values for the period length 4 of the second signal 2 are measured, as a result of which other equations follow and under certain circumstances a redundant equation system ensues, from which an optimization function may be derived, in the case of which for example the values for the period length fluctuation of the first signal 1 and the accumulated period length fluctuation of the second signal 2 can be determined according to the minimum error square method.

DETAILED DESCRIPTION

Figure 1:
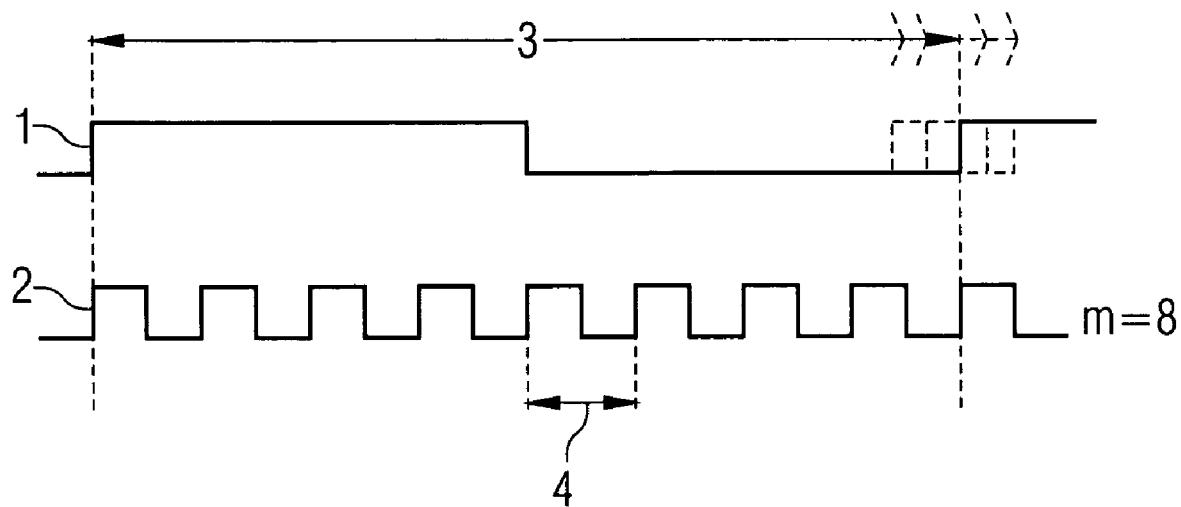
FIG. 1 shows the time-related curves of a first and a second signal with different period lengths.

FIG. 1 in principle shows the curve of a periodic first signal 1 and a periodic second signal 2, the first signal 1 having a period length 3, which is longer than the period length 4 of the second signal 2. The period length 3 of the first signal 1 is to be determined by counting the periods of the second signal 2, which arise during the period length 3 of the first signal 1. The number of these periods is designated in the following with m. In the case illustrated m=8.

The period length 3 of the first signal 1 in this case features certain fluctuations, as indicated by broken lines. Equally, the period length 4 of the second signal 2 features certain fluctuations, which however are not shown in FIG. 1.

In the following the case will be examined where the average period length of the first signal 1 is substantially constant and will be measured by means of a second signal 2 inscribable in the period length 4. When the period length 4 of the second signal 2 falls and/or the frequency of the second signal 2 rises, the number m, which is designated as reference number, must increase.

Figure 2:
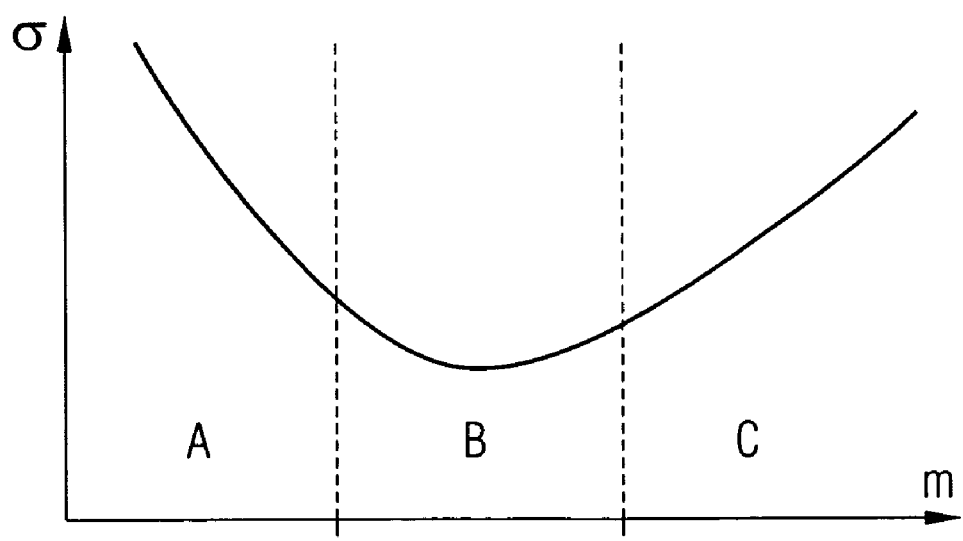
FIG. 2 shows the curve of the standard deviation of the measurement of the period length of a signal by counting periods of the second signal with a shorter period length.

In FIG. 2 the curve of the error in this period length measurement is shown over the reference number, which vice versa is again proportional to the period length 4 of the second signal 2. As a measure for the error when determining the period length fluctuation according to the aforementioned method, the standard deviation $\sigma$ of the measurement result, which ensues when the measurement is carried out several times is plotted in FIG. 2 and below. FIG. 2 shows the curve split into three zones A, B and C. In zone A the period length 4 of the second signal 2 is high, so that low values m result and therefore the standard deviation $\sigma$ is predominantly determined by the quantization error, which vice versa behaves proportionally to the reference number m. Accordingly, the curve for $\sigma$ falls in zone A with increasing m. In zone B the curve of the standard deviation possesses a minimum, whereby in this zone the standard deviation substantially equally depends on the period length fluctuations of the first signal 1 as well as the period length fluctuations of the second signal 2. In the case of the period length fluctuations of the second signal 2 it is to be stated that this always concerns accumulated period length fluctuations, since during a measurement length several periods of the second signal 2 arise, the period length fluctuations of which are added together.

With increasing reference number m and/or falling period length 4 of the second signal 2 in zone C the curve of the standard deviation again rises, since in the case of high reference number m and/or high number of counted periods of the second signal 2 the effect of the period length fluctuations of the second signal 2 becomes greater. In this zone the curve behaves roughly proportionally to the square root of the reference number m.

To carry out the measurement two period lengths are now calculated, whereby the first period length is determined in such a way that the corresponding reference number m during the measurement lies at the minimum of the curve of the standard deviation $\sigma$ in zone B and the second value of the period length is lower and lies in zone C. For the two values of the period length 4 of the second signal 2 the period length measurement for the first signal 1 is now carried out several times and two values for the standard deviation $\sigma_B$ and $\sigma_C$ are obtained, $\sigma_B$ being the value of the standard deviation, which was determined for the reference number m lying in zone B. The same applies for the value $\sigma_C$.

Figure 3:
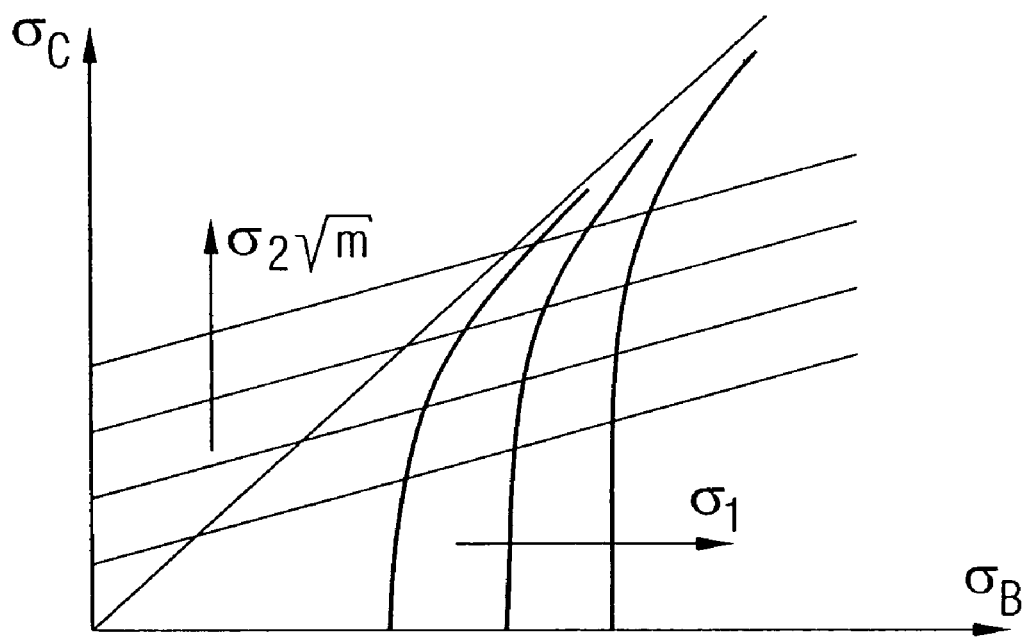
FIG. 3 shows, for various combinations of the period length fluctuation of the first and of the second signal, the values resulting from measuring different period lengths of the second signal.

FIG. 3 as already described above shows a diagram the surface plane of which is covered by the values for $\sigma_B$ and $\sigma_C$. In this plane, the places, which in the plane of $\sigma_B$ and $\sigma_C$ ensue for certain value combinations for the standard deviation $\sigma_1$ of the period length fluctuation of the signal 1 and the standard deviation $\sigma^2 \sqrt{m}$ of the accumulated period length fluctuations of the second signal 2, are indicated by way of two example curve families.

The substantially horizontal and straight running curve family represents the curves on which the standard deviation $\sigma^2 \sqrt{m}$ of the period length fluctuation of the second signal 2 is constant, whereas the curve family running substantially perpendicular and arched upwards indicates the places at which the standard deviation sigma.1 of the period length fluctuation of the first signal 1 is constant. The arrow pointing to the right and designated with sigma. 1 indicates the direction in which the curves with a higher standard deviation of the period length fluctuation of the first signal 1 lie. The same applies for the arrow pointing upwards and designated with $\sigma^2 \sqrt{m}$ for increasing values of the standard deviation of the accumulated period length fluctuation of the second signal 2.

For the graphic solution the place, which results from the two measured values for $\sigma_B$ and $\sigma_C$ for the two different period lengths of the second signal 2, can be marked in this diagram shown in FIG. 3. Subsequently, it is determined which two curves of both curve families intersect at this place and depending thereon the value sigma.1 for the standard deviation of the period length fluctuations of the first signal 1 and the value $\sigma^2 \sqrt{m}$ for the accumulated period length fluctuations of the second signal 2 can be established.

Figure 4:
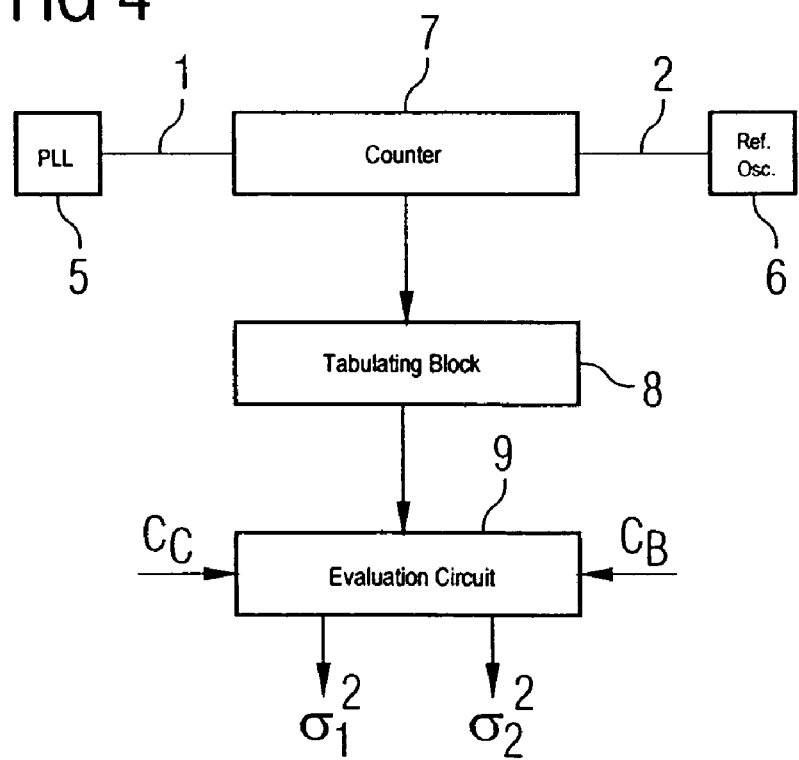
FIG. 4 shows the circuit diagram of an apparatus for calculating the period length fluctuations of both signals.

FIG. 4 shows an arithmetical solution, whereby the case is illustrated where the first signal 1 is the output signal of a phase-locked loop 5 and the second signal 2 is the output signal of a reference oscillator 6, the period length and/or frequency of which can be varied and/or at least switched between two values. The two signals 1, 2 are fed to a counter 7, which can count the number of periods of the second signal 2, that can be inscribed in a period of the first signal 1 and/or arise during this time-span. The circuit arrangement shown in FIG. 4 also comprises a (not illustrated) control device, which controls the various components in a suitable way. The measurements are carried out by the counter 7 for the two different values for the period length of the second signal 2 and passed onto a tabulating block 8 in which the statistical evaluation takes place. To this end for the two different period lengths of the second signal 2 the standard deviation of the measurement results and/or the counter figures calculated by the counter 7 are formed respectively in the tabulating block 8. The tabulating block 8 therefore calculates the two values $\sigma_B$ and $\sigma_C$, which it passes onto an evaluation circuit 9. From the two values $\sigma_B$ and $\sigma_C$ this calculates the squared standard deviation and/or variance $\sigma_1^2$ and $\sigma_2^2$ for the first signal 1 and/or the second signal 2. In this case, the reference number m is considered in the evaluation block 9 and regression coefficients CB and CC which have been previously calculated arithmetically or experimentally and stored in the apparatus are also taken into account.

The apparatus shown in FIG. 4 can be implemented in an integrated circuit for example and an estimate of the period length fluctuations of the first signal 1 of the phase-locked loop 5 can be carried out whenever the integrated circuit is switched on as self-test routine.

It is therefore intended that the foregoing detailed description be regarded as illustrative rather than limiting, and that it be understood that it is the following claims, including all equivalents, that are intended to define the spirit and scope of this invention.

The invention claimed is:

1. A method for detecting period length fluctuations of at least one of a periodic first signal and of a periodic second signal in which a period length of the second signal is shorter than a period length of the first signal and a reference number of the periods of the second signal that arise in the time-span of a base number of periods of the first signal is obtained, the method comprising:
   determining a first reference number for a first period length of the second signal and a second reference number for a second period length, different from the first period length, of the second signal; and
   calculating a measure for the period length fluctuation of at least one of the first signal and of the second signal dependent on the first and second reference number.

2. The method according to claim 1, further comprising determining at least one reference number of the first and second reference numbers several times.

3. The method according to claim 2, further comprising determining a standard deviation of period lengths of a signal of the first and second signals as a measure for the period length fluctuation of the signal.

4. The method according to claim 1, further comprising selecting the first period length of the second signal such that the effect of the period length fluctuation of the first signal is greater than the effect of the period length fluctuation of the second signal on the first reference number.

5. The method according to claim 1, further comprising selecting the second period length of the second signal such a manner that the effect of the period length fluctuation of the first signal is less than the effect of the period length fluctuation of the second signal on the second reference number.

6. The method according to claim 1, wherein the base number of periods of the first signal is 1.

7. The method according to claim 1, wherein the first signal is an output signal of a phase-locked loop and the second signal is an output signal of a reference oscillator.

8. The method according to claim 1, further comprising carrying out the method in an integrated semiconductor as a self-test.

9. The method according to claim 1, wherein at the start of determining a reference number, the first signal and the second signal are in phase.

10. The method according to claim 1, further comprising determining at least one of the period length fluctuation of the first signal and of the second signal dependent on previously calculated regression coefficients.

11. An apparatus for detecting period length fluctuations of at least one of a periodic first signal and a periodic second signal in which a period length of the second signal is shorter than a period length of the first signal, wherein the apparatus comprises an evaluation circuit that: determines a reference number from periods of the second signal that arise in the time-span of a base number of periods of the first signal; and determines a first reference number for a first period length of the second signal and a second reference number for a second period length, different from the first period length of the second signal, dependent on the first reference number and the second reference number, and wherein a measure of the period length fluctuation of at least one of the first signal and of the second signal is determined.

12. The apparatus according to claim 11, further comprising a reference oscillator for producing the second signal.

13. The apparatus according to claim 11, further comprising a phase-locked loop, wherein the apparatus designed such that an output signal of the phase-locked loop is the first signal.

14. The apparatus according to claim 11, wherein the apparatus is an integrated semiconductor.

15. An apparatus according to claim 11, wherein at least one reference number of the first and second reference numbers is determined several times.

16. An apparatus according to claim 15, wherein as a measure for the period length fluctuation of a signal of the first and second signals the standard deviation of period lengths of the signal is determined.

17. An apparatus according to claim 11, wherein the first period length of the second signal is selected such that the effect of the period length fluctuation of the first signal is greater than the effect of the period length fluctuation of the second signal on the first reference number.

18. An apparatus according to claim 11, wherein the second period length of the second signal is selected such that the effect of the period length fluctuation of the first signal is less than the effect of the period length fluctuation of the second signal on the second reference number.

19. An apparatus according to claim 11, wherein the base number of periods of the first signal is 1.

* * * * *